(12) United States Patent
Alvarez Serrano

(10) Patent No.: US 8,297,892 B2
(45) Date of Patent: Oct. 30, 2012

(54) CUTTING APPARATUS

(75) Inventor: Esteban Arturo Alvarez Serrano, Ensenada B. C. (MX)

(73) Assignees: Sony Corportion, Minato-Ku (JP); Sony Electronics, Inc., Park Ridge, NJ (US)

( * ) Notice: Subject to any disclaimer, the term of this patent is extended or adjusted under 35 U.S.C. 154(b) by 1170 days.

(21) Appl. No.: 12/213,240

(22) Filed: Jun. 17, 2008

(65) Prior Publication Data

US 2009/0308217 A1    Dec. 17, 2009

(51) Int. Cl.
*B23C 1/06* (2006.01)

(52) U.S. Cl. ........ 409/159; 409/202; 409/219; 409/235; 408/234

(58) Field of Classification Search ............... 409/138, 409/159, 185, 189, 197, 202, 219, 235; 408/234
See application file for complete search history.

(56) References Cited

U.S. PATENT DOCUMENTS

| | | | | |
|---|---|---|---|---|
| 4,970,765 A * | 11/1990 | Sakawa et al. | ................. | 29/33 P |
| 4,984,351 A * | 1/1991 | Matsuyama et al. | .............. | 483/4 |
| 4,999,895 A * | 3/1991 | Hirose et al. | ................... | 29/33 P |
| 5,980,172 A * | 11/1999 | Shoda | ............................. | 409/203 |
| 6,409,642 B2 * | 6/2002 | Tominaga et al. | .............. | 483/16 |
| 6,609,294 B1 | 8/2003 | Smith et al. | | |
| 2001/0048287 A1 | 12/2001 | Vandelac | | |

FOREIGN PATENT DOCUMENTS

| | | |
|---|---|---|
| DE | 4015570 A1 * | 11/1991 |
| EP | 1413409 A2 * | 4/2004 |
| JP | 59201732 A * | 11/1984 |

OTHER PUBLICATIONS

Abstract Translation—Araki et al (1984). JP 59201732 A.*
EPO Machine Translation—Havenith, Hubert (1991). DE 4015570 A1.*
PEARS World of Electronics. "'FX-5R' PCB Routing Machine." Jan. 14, 2008.*

* cited by examiner

*Primary Examiner* — Daniel Howell
*Assistant Examiner* — Michael Vitale
(74) *Attorney, Agent, or Firm* — Haverstock & Owens

(57) ABSTRACT

A cutting apparatus includes a base frame, a pair of holder assemblies, an overhead frame, a cutter assembly and a controller. The pair of holder assemblies are operably connected to the base frame with one holder assembly holding the first workpiece and the other holding the second workpiece. The pair of holder assemblies independently move relative to one another along a transverse axis. The overhead frame is connected to the base frame. The cutter assembly is connected to the overhead frame and moves along a vertical axis and a horizontal axis. The cutter assembly includes a rotary cutter mechanism with a rotating cutting tool. The controller controls and moves of the pair of holders and the cutter assembly so that the rotating cutting tool cuts the first workpiece in a first desired configuration then moves to the second workpiece to cut the second workpiece in a second desired configuration.

12 Claims, 11 Drawing Sheets

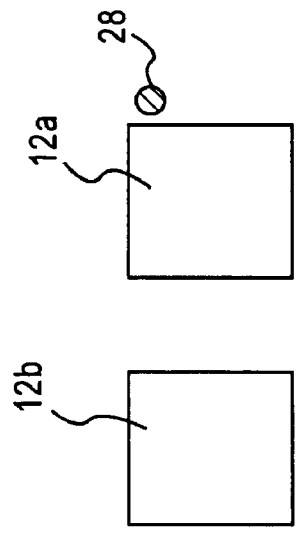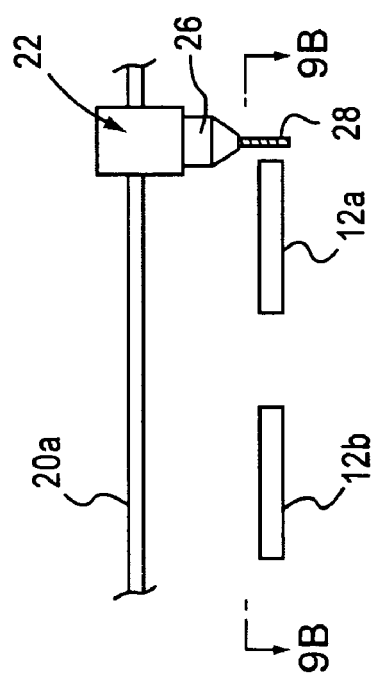
FIG.9A
FIG.9B
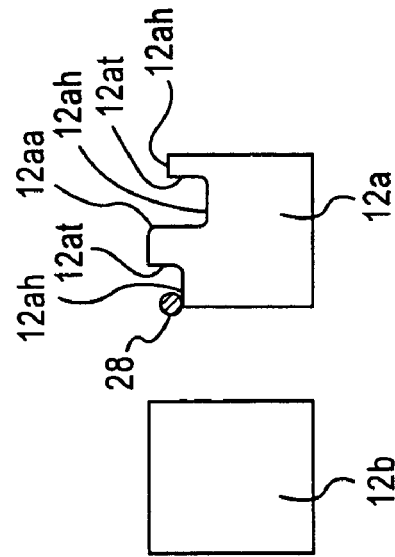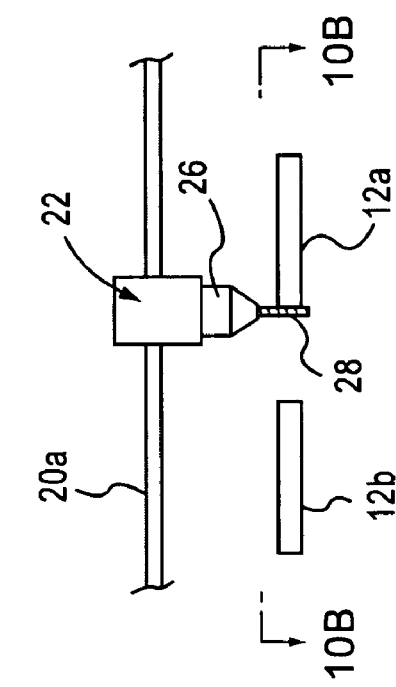
FIG.10A
FIG.10B

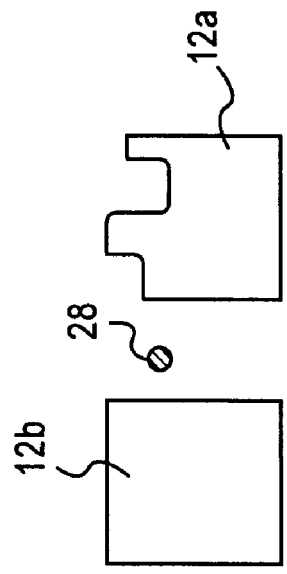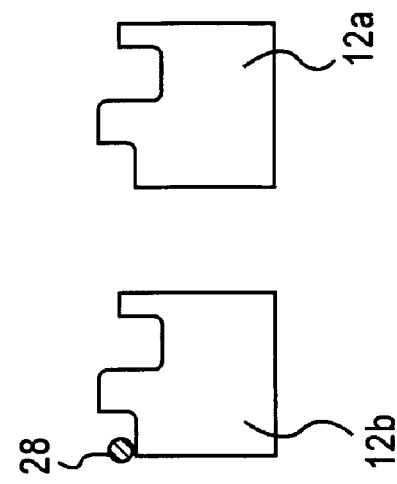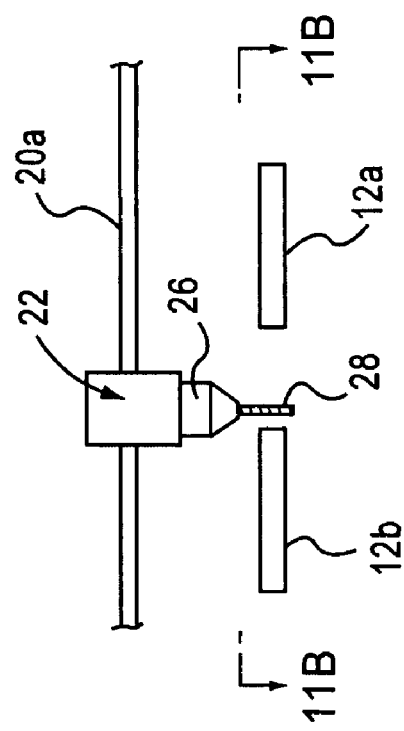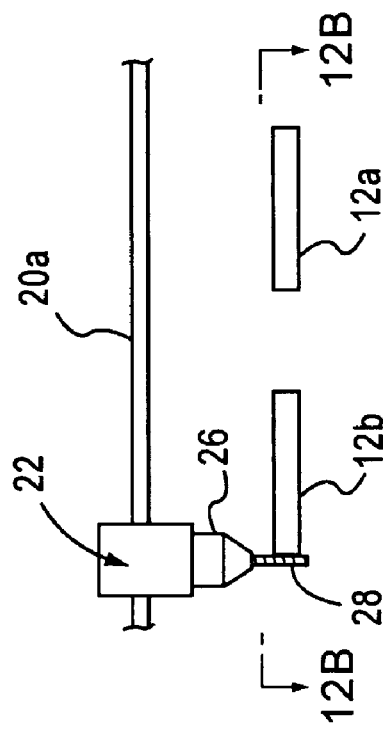
FIG. 11B
FIG. 12B
FIG. 11A
FIG. 12A

CUTTING APPARATUS

FIELD OF THE INVENTION

The present invention relates to a cutting apparatus. More particularly, the present invention is directed to a cutting apparatus for removing waste board material from a printed wiring board.

BACKGROUND OF THE INVENTION

A printed wiring board includes, as a component, a dielectric layer of either a reinforced or non-reinforced resin that is known in the art as a prepreg. On the opposite sides of the prepreg are bonded conductive metal foil sheets. Subsequently, after curing, the metal on the laminate, through a number of photolithographic processes, is etched to produce conductive paths, or circuits, on the surface of the cured dielectric layer. This layer may be used individually as a two sided printed wiring board or assembled with other etched layers to produce a multilayer printed wiring board.

These printed wiring boards are typically assembled by alternately stacking conductive metal foil sheets, prepreg sheets and separator sheets into a press "book". The book is then inserted into a lamination press where it is cured under heat and pressure into a printed wiring board laminate. After pressing, the cured, metal-clad laminates are typically detached from the separator sheets and are subjected to further processing.

Sometimes, the printed wiring boards have waste board material that must first be removed so that the printed wiring boards fit appropriately on a conveyor belt in preparation for assembly. One system of removing the waste board material is by using scissors to remove the waste board material so that the printed wiring boards have a predetermined configuration. Also, some systems for removing the waste board material can only process one printed wiring board at a time.

It would be beneficial to provide a cutting apparatus for removing waste board from printed wiring boards in a more efficient manner. The present invention provides this benefit.

OBJECTS AND SUMMARY OF THE INVENTION

It is an object of the invention to provide a cutting apparatus for removing waste board from printed wiring boards in a more efficient manner.

An exemplary embodiment of a cutting apparatus of the present invention cuts a first workpiece and subsequently cuts a second workpiece. The cutting apparatus includes a base frame, a pair of holder assemblies, an overhead frame, a cutter assembly and a controller. The base frame extends along and about a horizontal axis, a vertical axis and a transverse axis with the horizontal axis, the vertical axis and the transverse axis extending perpendicularly to and intersecting one another to form a Cartesian coordinate system. The pair of holder assemblies are operably connected to the base frame and are disposed in a juxtaposed relationship with one another. One of the pair of holder assemblies is sized and adapted to hold the first workpiece and a remaining one of the pair of holder assemblies is sized and adapted to hold the second workpiece.

The pair of holder assemblies are independently movable relative to one another with the respective ones of the first and second workpieces being simultaneously movable therewith along the transverse axis in back-and-forth directions. The overhead frame is connected to and is disposed above the base frame. The cutter assembly is connected to the overhead frame and is operative to move along the vertical axis in up-and-down directions and the horizontal axis in side-to-side directions. The cutter assembly includes a rotary cutter mechanism having a rotating cutting tool. The controller is in communication with and is operative to control and move of the pair of holders and the cutter assembly in a manner such that the rotating cutting tool cuts the first workpiece in a first desired configuration then moves to the second workpiece to cut the second workpiece in a second desired configuration.

This object and other advantages of the present invention will be better appreciated in view of the detailed description of the exemplary embodiment of the present invention with reference to the accompanying drawings, in which:

BRIEF DESCRIPTION OF THE DRAWINGS

FIG. 9A and FIG. 9B which is taken along line 9B-9B in FIG. 9A are diagrammatical views of the cutter mechanism in a first pre-cut position.

FIG. 10A and FIG. 10B which is taken along line 10B-10B in FIG. 10A are diagrammatical views of the cutter mechanism in a first post-cut position.

FIG. 11A and FIG. 11B which is taken along line 11B-11B in FIG. 11A are diagrammatical views of the cutter mechanism in a second pre-cut position.

FIG. 12A and FIG. 12B which is taken along line 12B-12B in FIG. 12A are diagrammatical views of the cutter mechanism in a second post-cut position.

DETAILED DESCRIPTION OF THE EXEMPLARY EMBODIMENT

Figure 1:
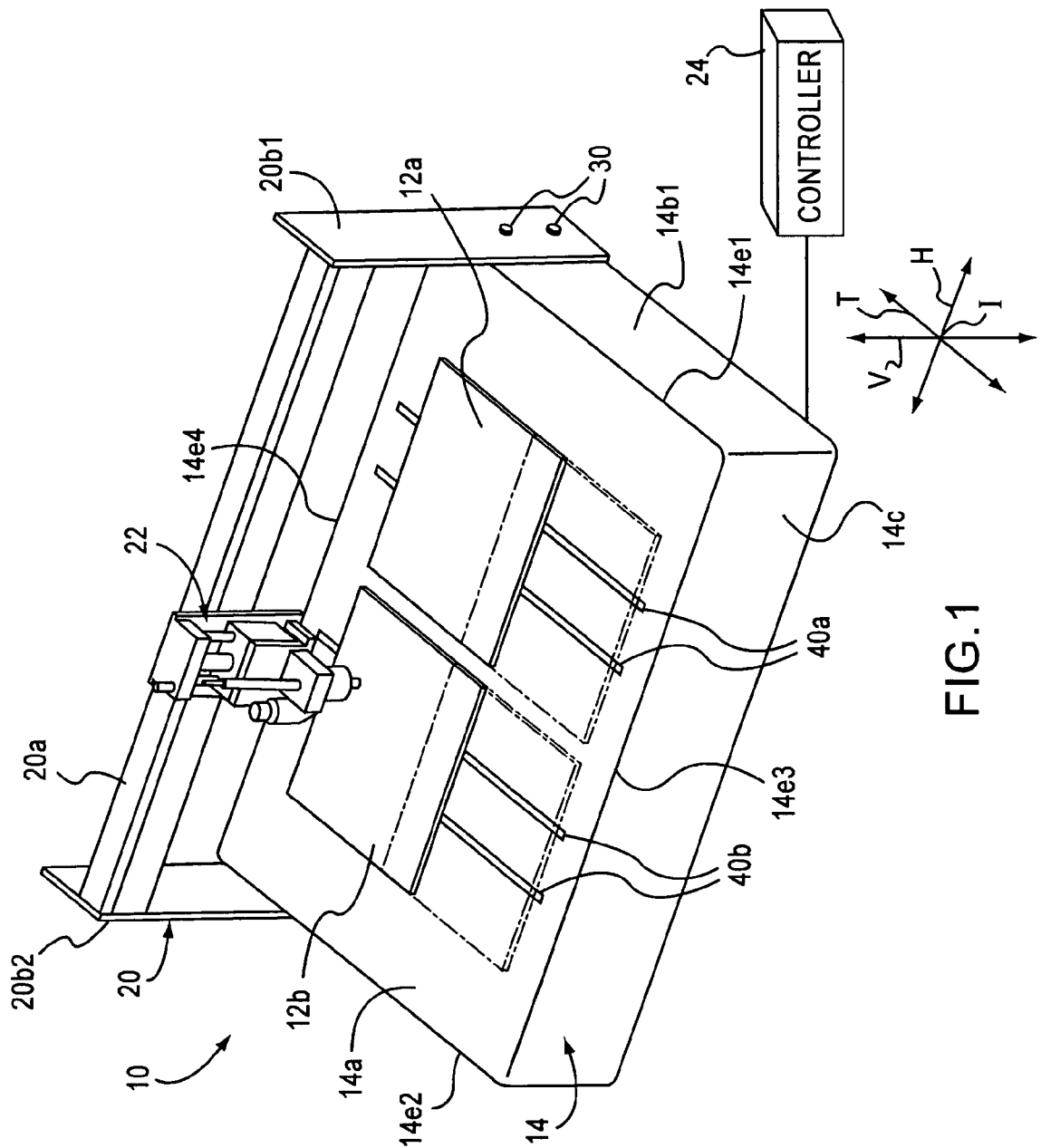
FIG. 1 is a perspective view an exemplary embodiment of a cutter apparatus of the present invention.

Hereinafter, embodiments of the present invention will be described with reference to the attached drawings. The structural components common to those of the prior art and the structural components common to respective embodiments of the present invention will be represented by the same symbols and repeated description thereof will be omitted.

An exemplary embodiment of a cutter apparatus 10 of the present invention is hereinafter described with reference to FIGS. 1-13D. As best shown in FIGS. 1-5, the cutting apparatus 10 is adapted to cut a first printed wiring board, commonly known as a "PWB" and referred to hereinafter as a first workpiece 12a, and subsequently a second PWB, referred to hereinafter as a second workpiece 12b, to form pre-determined configurations. Cutting of the first and second workpieces 12a and 12b into their predetermined configurations are described in more detail below. The cutting apparatus 10 includes a base frame 14, a pair of holder assemblies 16 and 18, an overhead frame 20, a cutter assembly 22 and a controller 24.

As best shown in FIG. 1, the base frame 14 in a form of a box-shaped construction extends along and about a horizontal axis H, a vertical axis V and a transverse axis T. In FIG. 1, the horizontal axis H, the vertical axis V and the transverse axis T extend perpendicularly to each other and also intersect one another at an intersection point I to form a conventional Cartesian coordinate system.

The pair of holder assemblies 16 and 18 are operably connected to the base frame 14 and are disposed in a juxtaposed relationship with one another. One of the pair of holder assemblies, namely holder assembly 16, is sized and adapted to hold the first workpiece 12a and a remaining one of the pair of holder assemblies, namely holder assembly 18, is sized and adapted to hold the second workpiece 18. As discussed in more detail below, the pair of holder assemblies 16 and 18 are independently movable relative to one another with the respective ones of the first and second workpieces 12a and 12B along the transverse axis T. Also, as would be understood by one of ordinary skill in the art, the first and second workpieces 12a and 12b simultaneously move with their respective holder assemblies 16 and 18 along the transverse axis T.

Figure 2:
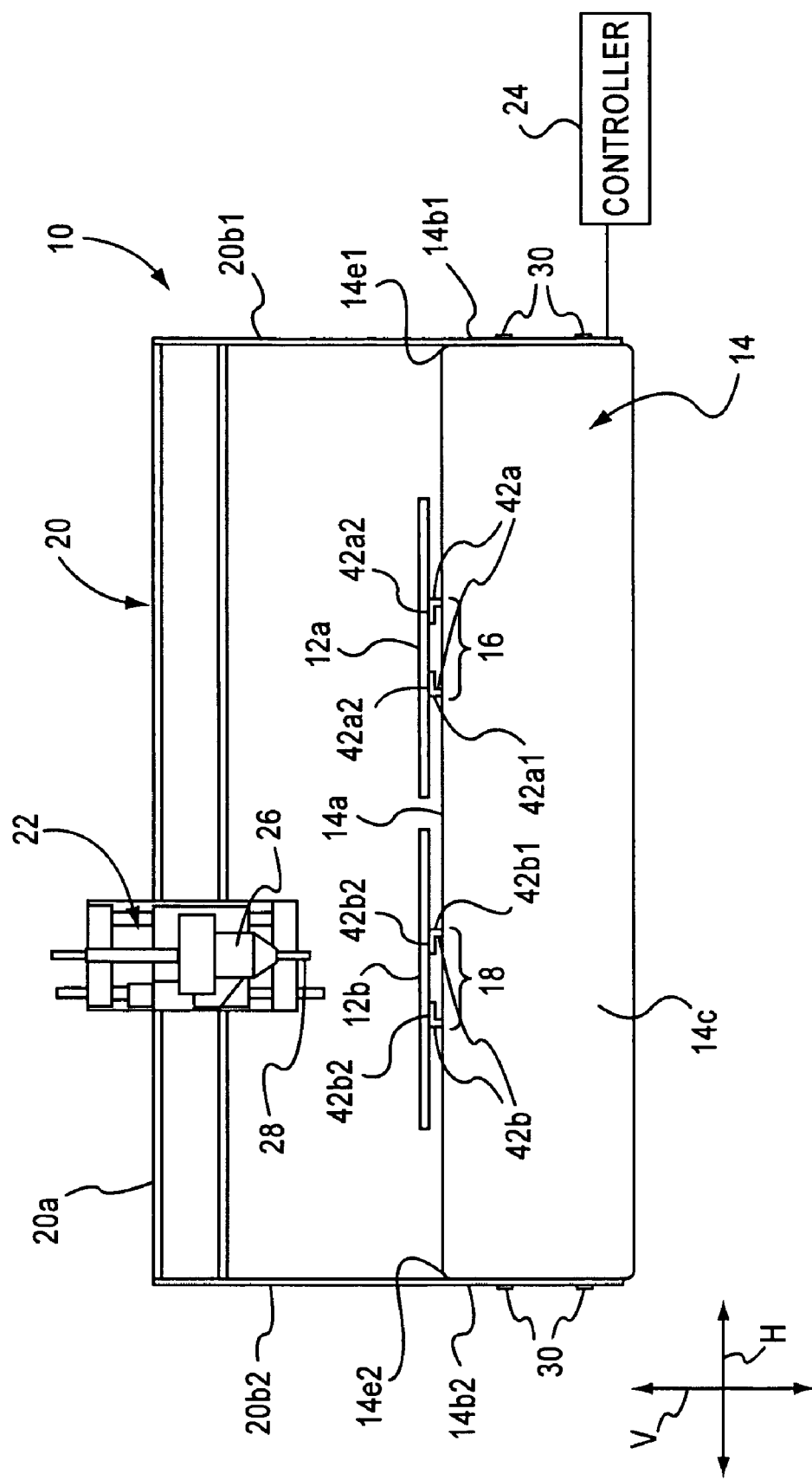
FIG. 2 is a front side elevational view of the cutter apparatus of the present invention in FIG. 1.
Figure 3:
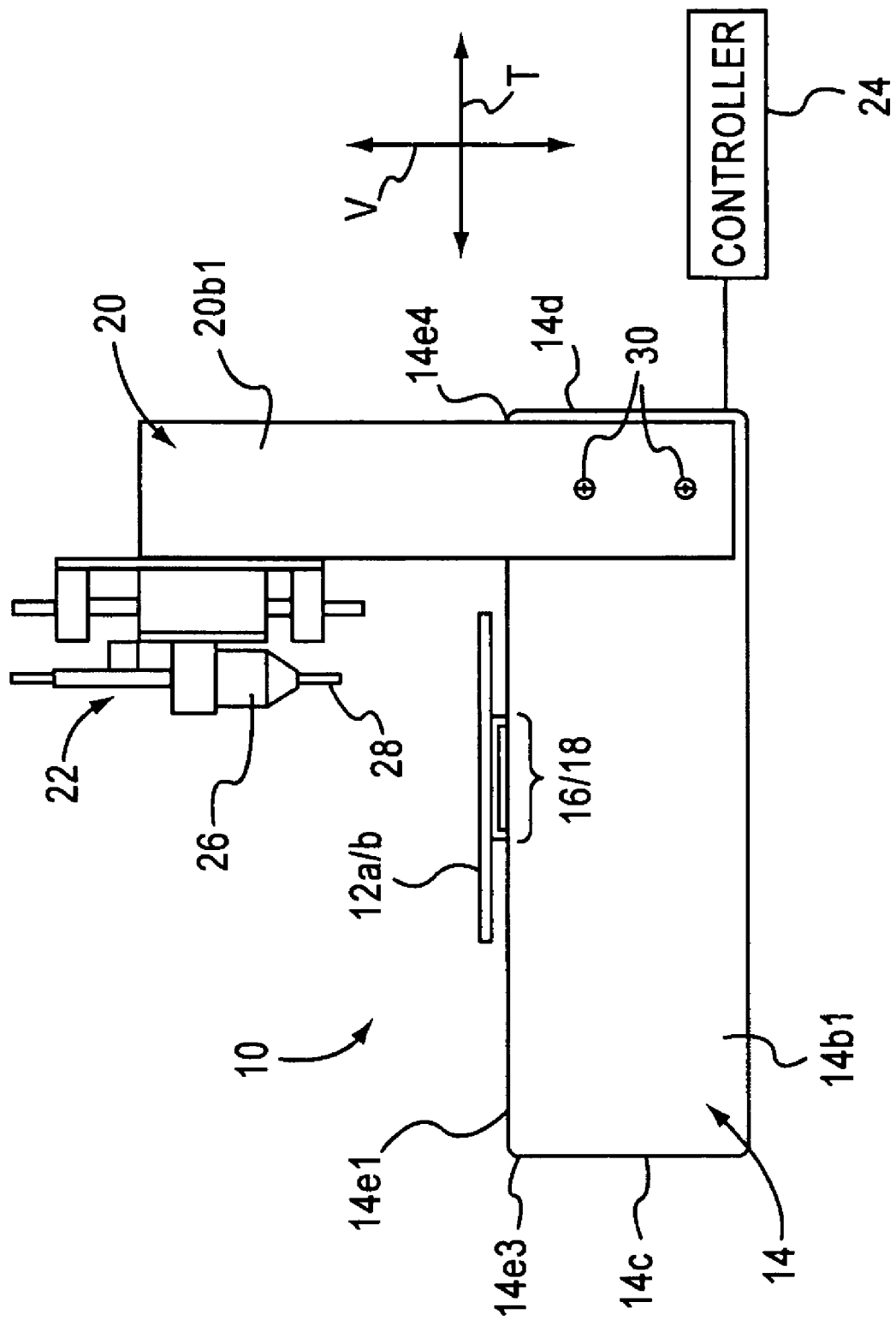
FIG. 3 is a side elevational view of the cutter apparatus of the present invention in FIG. 1.
Figure 6:
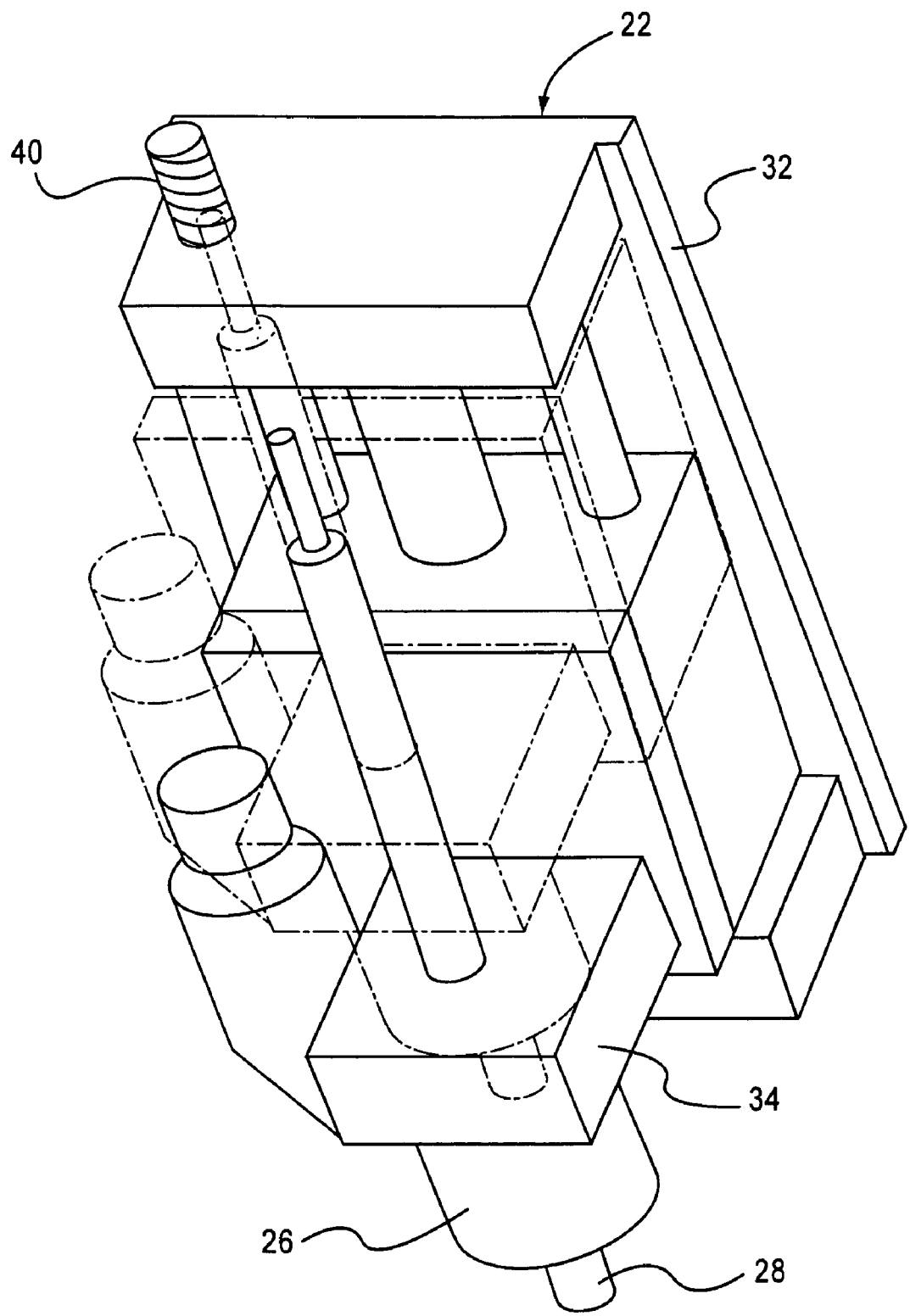
FIG. 6 is a perspective view of a cutter mechanism which is a components of the cutter apparatus of the present invention.
Figure 7:
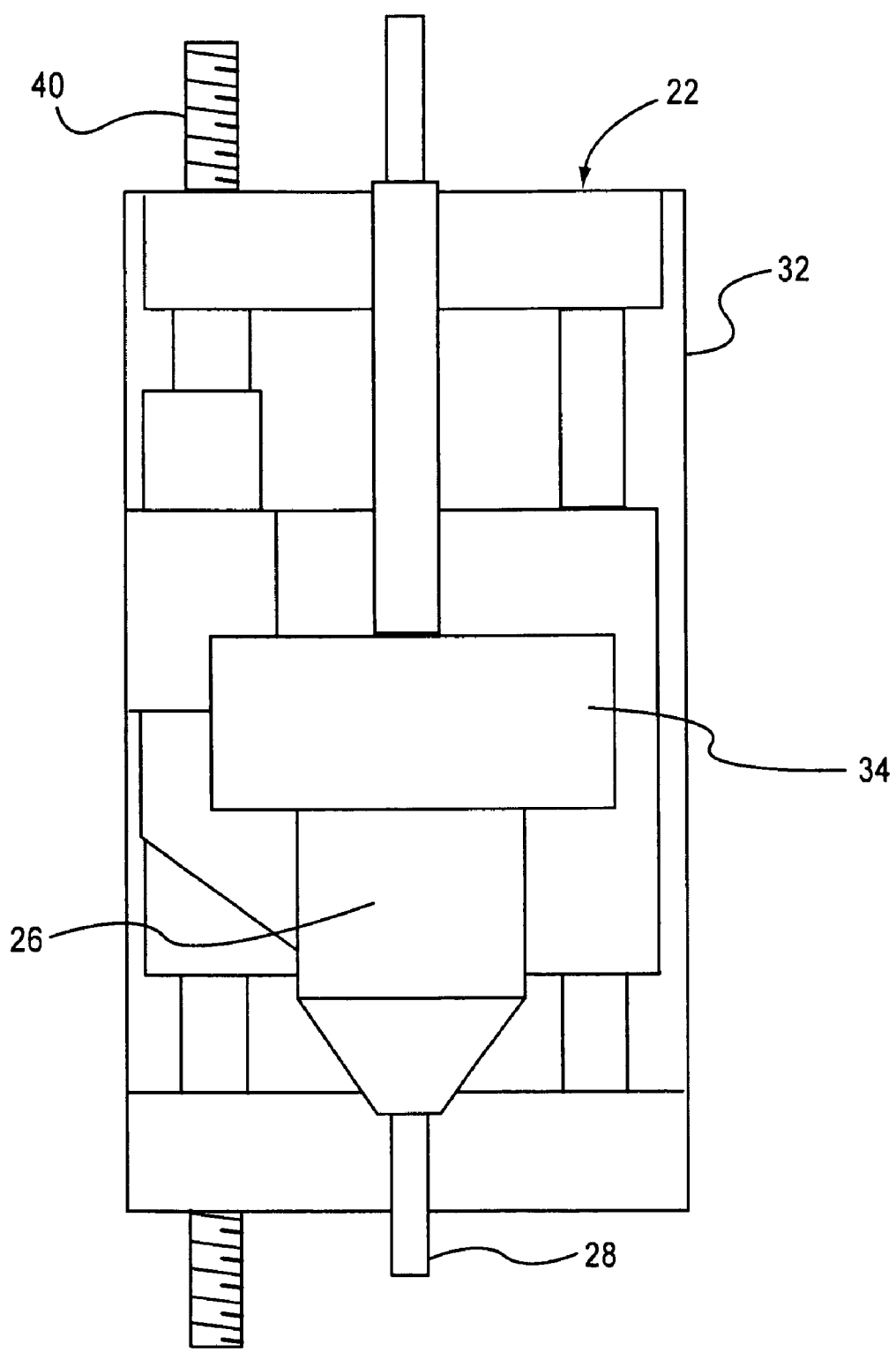
FIG. 7 is a front elevational view of the cutter mechanism shown in FIG. 6.
Figure 8:
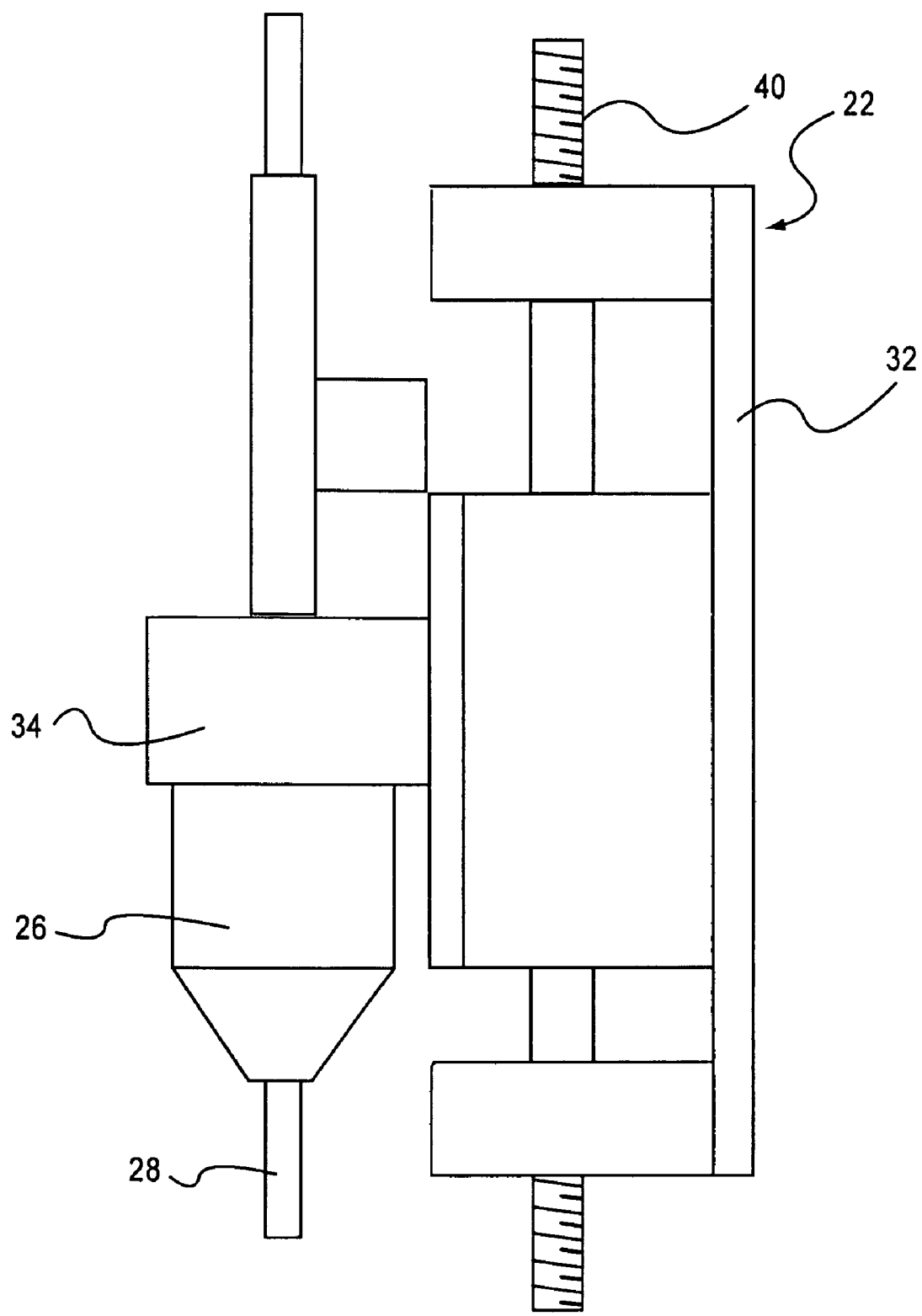
FIG. 8 is a side elevational view of the cutter mechanism shown in FIG. 6.
Figure 13A:
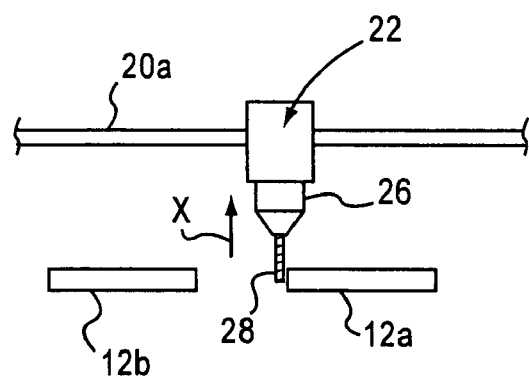
FIGS. 13A-13D are diagrammatical views of the cutter mechanism in a transition stage moving from the first post-cut position to the second pre-cut position.
Figure 13B:
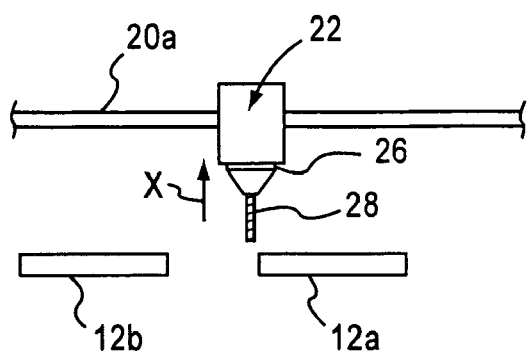
Figure 13C:
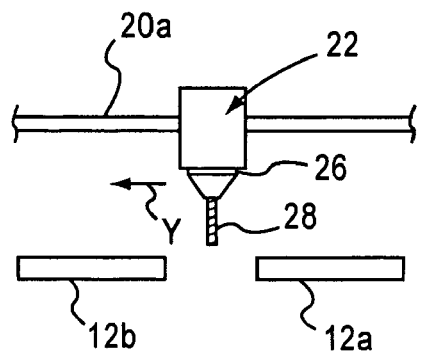
Figure 13D:
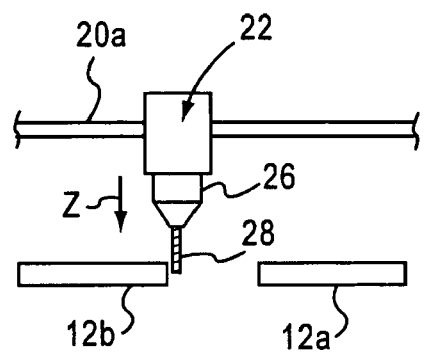

As best shown in FIGS. 1-3, the overhead frame 20 is connected to and is disposed above the base frame 14. The cutter assembly 22 is connected to the overhead frame 20 and is operative to move along the vertical axis V as well as the horizontal axis H. As illustrated in FIGS. 6-8, the cutter assembly 22 includes a rotary cutter mechanism 26 that has a rotating cutting tool 28. The rotary cutter mechanism 26 may be, for example, a conventional drill device with an electric motor and a chuck and the rotary cutting tool 28, maybe for example, a conventional router bit held to the conventional drill by the chuck.

The controller 24 communicates with the pair of holder assemblies 16 and 18 and the cutter assembly 22 and is operative to control and move of the pair of holder assemblies 16 and 18 and the cutter assembly 22 in a manner such that the rotating cutting tool 28 cuts the first workpiece 12a in a first desired configuration (See FIG. 10B discussed below) then moves to the second workpiece 12b to cut the second workpiece 12b in a second desired configuration (See FIG. 12B discussed below).

Figure 4:
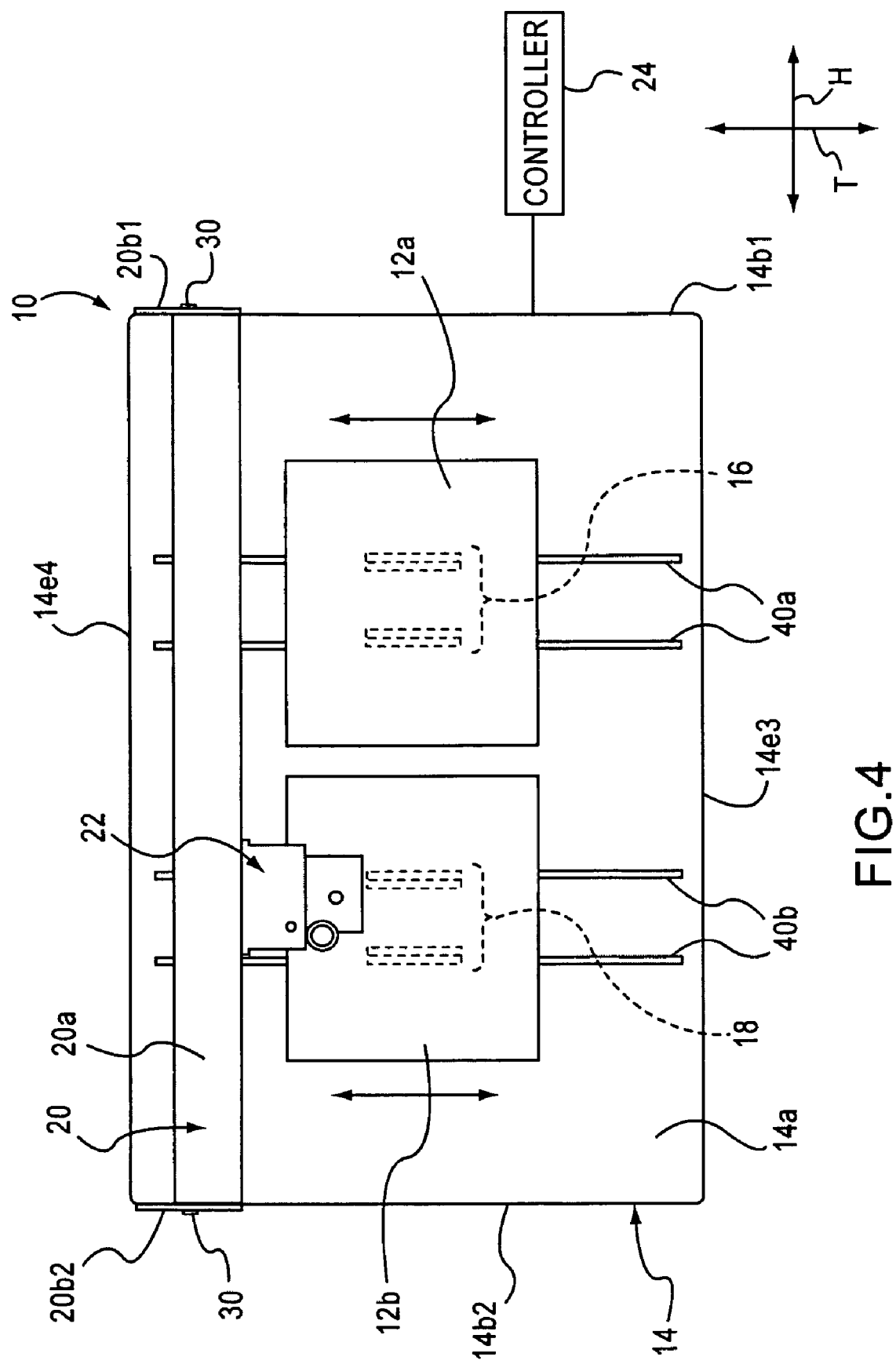
FIG. 4 is a top planar view shown of the cutter apparatus of the present invention in FIG. 1.

As mentioned above, the base frame 14, by way of example only and not by way of limitation, is a box-shaped construction. The base frame 14 includes a table-top panel 14a, a pair of side panels 14b1 and 14b2, a front panel 14c and a rear panel 14c. The table-top panel 14a extends horizontally and transversely. The pair of side panels 14b1 and 14b2 are connected to and depend downwardly from the table-top panel 14a along an opposing parallel pair of side panel edges 14e1. With reference to FIGS. 1, 2 and 4, the first pair of side panels 14b1 and 14b2 facially oppose each other in a parallel manner and extend vertically along the vertical axis V and transversely along the transverse axis T. The front panel 14c is connected to and depends downwardly from the table-top panel 14a along a front panel edge 14e3. The front panel 14c extends vertically along the vertical axis V and horizontally along the horizontal axis H. The rear panel 14d facially opposes the front panel 14c in a parallel manner and extends vertically along the vertical axis V and horizontally along the horizontal axis H. The rear panel 14d is connected to and depends downwardly from the table-top panel 14a along a rear panel edge 14e4. The rear panel 14d extends parallel to the front panel 14c. The front and rear panels 14c and 14d respectively are connected to and between respective ones of the pair of side panels 14b1 and 14b2.

The overhead frame 20 includes a cross member 20a and a pair of vertically-extending support members 20b1 and 20b2. As best illustrated in FIGS. 1, 2 and 4, the support members 20b1 and 20b2 are spaced apart from one another and are facially opposed to one another in a parallel manner. Respective ones of the support members 20b1 and 20b2 are fixedly connected to respective ones of the pair of side panels 14b1 and 14b2 by conventional screws 30. However, one of ordinary skill in the art would appreciate that the support members 20b1 and 20b2 could be fixedly connected to the side panels 14b1 and 14b2 by any other conventional means, such as by welding. The support members 20b1 and 20b2 project vertically relative to the table-top member 14a and, as best shown in FIGS. 2 and 3, project vertically above the table-top panel 14a. Also, the cross-member 20a connected to and between the pair of support members 20b1 and 20b2 by any conventional connecting means. Further, the cross-member 20a is disposed above the table-top panel 14a and the pair of holder assemblies 16 and 18 as illustrated in FIGS. 1 and 2.

Figure 5:
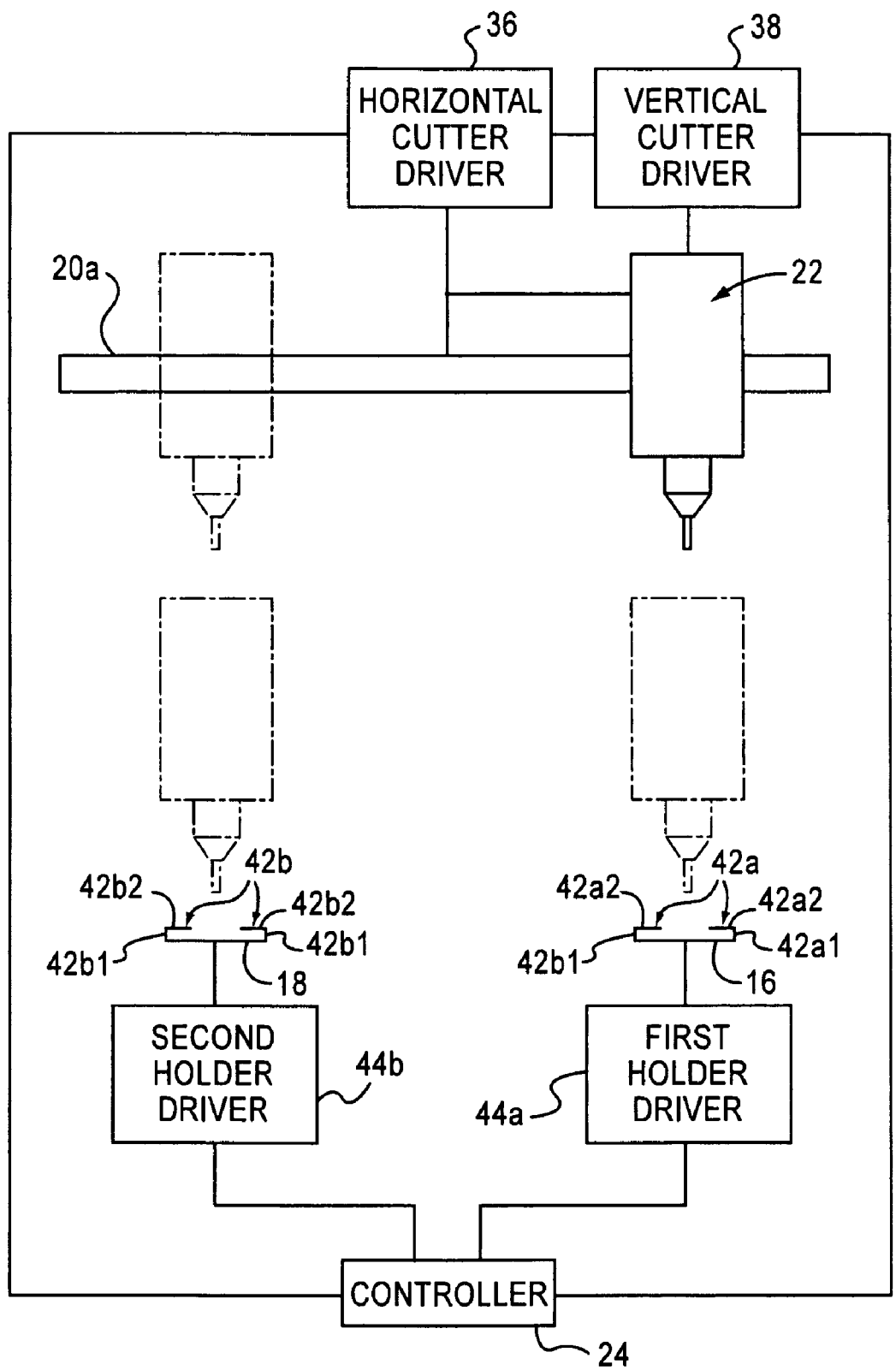
FIG. 5 is a diagrammatical view of the cutter apparatus of the present invention.

In FIGS. 6-8, the cutter assembly 22 includes a cutter base panel 32 and a cutter mounting panel 34 operably connected to the cutter base panel 32. As shown in FIG. 5, the cutter base panel 32 is operably connected to the cross-member 20a so that the cutter assembly 22 can move horizontally across the cross-member 20a. The cutter mounting panel 34 is fixedly connected to the rotary cutter mechanism 26 and the cutter mounting panel 34 is operably connected to the cutter base panel 32 so that the rotary cutter mechanism 26 is vertically movable relative to the cutter base panel 32. Again, with reference to FIG. 5, a horizontal cutter driver 36 is associated with the cross-member 20a and cutter base panel 32 of the cutter assembly 22. The horizontal cutter driver 36 is operative in conjunction with the controller 24 to move the cutter assembly 22 horizontally along the cross-member 20a as reflected in FIG. 5.

Also, a vertical cutter driver 38 is associated with the cutter base panel 32 and cutter mounting panel 34 and the vertical cutter driver 38 is operative in conjunction with the controller 24 to move the rotary cutter mechanism 26 and the rotating cutting tool 28 vertically relative to the cutter base panel 32. By way of example only and not by way of limitation, a screw-shaft 40 is employed to vertically drive the cutter mounting panel 34, the rotary cutter mechanism 26 and the rotating cutting tool 28 vertically in the up-and-down directions relative to the cutter base panel 32.

In FIGS. 1 and 4, the table-top panel 14a includes two pairs of slots 40a and 40b that extend through the table-top panel 14a. The two pairs of slots 40a and 40b are juxtaposed to one another and extend parallel to each other along the transverse axis T.

With reference to FIGS. 2 and 5, each one of the pair of holder assemblies 16 and 18 includes a pair of angle members 42a and 42b. Each angle member 42a and 42b has a first angle portion 42a1 and 42b1 projecting upwardly from the table-top panel 14a through a respective one of the pair of slots 40a and 40b and a second angle portion 42a2 and 42b2 that is connected to a distal end of the first angle portion 42a1 and 42b1 respectively and extends perpendicularly to the first angle portion 42a1 and 42b1 respectively. As illustrated in FIG. 5, one pair of angle members 42a is operably connected to a first holder driver 44a for transversely moving the holder assembly 16 and a remaining pair of angle members 42b is operably connected to a second holder driver 44b for transversely moving the holder assembly 18 along respective ones of the pair of slots 40a and 40b.

One of ordinary skill in the art would appreciate that the pair of holder assemblies 16 and 18 might be any other type of conventional holder useful for retaining flat workpieces thereon. By way of example only and not by way of limitation, each one of the pair of holder assemblies 16 and 18 might employ conventional suction devices to retain the workpieces thereon. Alternatively, each one of the pair of holder assemblies might have an adhesive with strong shear force resistance and weak tensile force resistance so that an operator can easily remove the workpiece cut to the desired configuration and replace it with a workpiece that has waste material to be removed.

Operation of the cutting apparatus 10 of the present invention is diagrammatically illustrated in FIGS. 9A-13D by way of example only. The controller 24 controls and moves at least the cutter assembly 22 during a first cutting stage (right side of FIGS. 9A and 10A), a second cutting stage (left side of FIGS. 11A and 12A) and a transition stage (FIGS. 13A-13D). The controller 24 controls and moves one of the pair of holder assemblies 16 or 18 during the first cutting stage (right side of FIGS. 9A and 10A) and a remaining one of the pair of holder assemblies 18 or 16 during the second cutting stage (left side of FIGS. 11A and 12A).

During the first cutting stage (right side of FIGS. 9A and 10A), the rotary cutter mechanism 26 moves from a first pre-cut position (right side of FIG. 9A) to a first post-cut position (right side of FIG. 10A). In the first pre-cut position (right side of FIG. 9A), the rotating cutting tool 28 is disposed adjacent the first workpiece 12a and moves either horizontally and transversely, simultaneously horizontally and transversely or horizontally, transversely and simultaneously horizontally and transversely to the first post-cut position (right side of FIG. 10A) to cut the first desired configuration.

One of ordinary skill in the art would appreciate that moving the rotating cutting tool 28 horizontally cuts the workpiece 12a, in this example, to form a horizontal cut portions 12ah, moving the rotating cutting tool 28 transversely cuts the workpiece 12a to form a transverse cut portions 12at and moving the rotating cutting tool 28 simultaneously horizontally and transversely cuts the workpiece 12a to form an arcuate cut portion 12aa.

During the second cutting stage (left side of FIGS. 11A and 12A), the rotary cutter mechanism 26 moves from a second pre-cut position (left side of FIG. 11A) to a second post-cut position (right side of FIG. 12A). In the second pre-cut position (left side of FIG. 11A), the rotating cutting tool 28 is disposed adjacent the second workpiece 12b and moves either horizontally and transversely, simultaneously horizontally and transversely or horizontally, transversely and simultaneously horizontally and transversely to the second post-cut position (left side of FIG. 12A) to form the second desired configuration. By way of example only and not by way of limitation, for purposes of the embodiment of the cutting apparatus 10 of the present invention, the first desired configuration and the second desired configuration are the same.

During the transition stage (FIGS. 13A-13D, the rotary cutter mechanism 26 moves from the first post-cut position (right side of FIG. 10A) to the second pre-cut position (left side of FIG. 11A). More specifically, the rotating cutting tool 28 moves vertically upwardly (FIG. 13A) from the first post-cut position (right side of FIG. 10A) a sufficient vertical distance (see arrow X) so that the rotating cutting tool 28 is disposed above the first workpiece 12a (FIG. 13B) and thereafter moves at least horizontally (see arrow Y in FIG. 13C) towards the second workpiece 12b and thereafter moves vertically downwardly (see arrow Z in FIG. 13D) to a position adjacent the second workpiece 12b until the rotary cutter mechanism is in the second pre-cut position (left side of FIG. 12A).

The cutting apparatus 10 of the present invention removing waste board material from printed wiring boards in a more efficient manner. A skilled artisan would appreciate that an operator can remove the workpiece cut to a desired configuration from the cutting apparatus 10 and can replace it with a workpiece that requires waste board material to be removed while another workpiece is already mounted to the cutting apparatus and being cut to a desired configuration.

The present invention, may, however, be embodied in various different forms and should not be construed as limited to the exemplary embodiment set forth herein; rather, this exemplary embodiment is provided so that this disclosure will be thorough and complete and will fully convey the scope of the present invention to those skilled in the art.

What is claimed is:

1. A cutting apparatus for cutting a first workpiece and subsequently a second workpiece, the cutting apparatus comprising:

a base frame extending along and about a horizontal axis, a vertical axis and a transverse axis with the horizontal axis, the vertical axis and the transverse axis extending perpendicular to and intersecting one another to form a Cartesian coordinate system;

a pair of holder assemblies operably connected to the base frame and disposed in a juxtaposed relationship with one another, one of the pair of holder assemblies sized and adapted to hold the first workpiece and a remaining one of the pair of holder assemblies sized and adapted to hold the second workpiece, the pair of holder assemblies independently movable relative to one another with the respective ones of the first and second workpieces being simultaneously movable therewith along the transverse axis in back-and-forth directions;

an overhead frame connected to and disposed above the base frame;

a cutter assembly connected to the overhead frame and operative to move along the vertical axis in up-and-down directions and the horizontal axis in side-to-side directions, the cutter assembly including a rotary cutter mechanism having a rotating cutting tool; and a controller in communication with and operative to control and move of the pair of holder assemblies and the cutter assembly in a manner such that the rotating cutting tool cuts the first workpiece in a first desired configuration then moves to the second workpiece to cut the second workpiece in a second desired configuration, wherein the base frame is a box-shaped construction including a table-top panel, wherein the table-top panel includes two pairs of slots extending through the table-top panel, juxtaposed to one another and parallel to each other along the transverse axis, wherein each one of the pair of holder assemblies includes a pair of angle members, each angle member having a first angle portion projecting upwardly from the table-top panel and a second angle portion connected to a distal end of the first angle portion and extending perpendicularly to the first angle portion.

2. The cutting apparatus according to claim 1, wherein the controller controls and moves at least the cutter assembly during a first cutting stage, a second cutting stage and a transition stage.

3. The cutting apparatus according to claim 2, wherein the controller controls and moves one of the pair of holder assemblies during the first cutting stage and a remaining one of the pair of holder assemblies during the second cutting stage.

4. The cutting apparatus according to claim 2, wherein, during the first cutting stage, the rotary cutter mechanism moves from a first pre-cut position to a first post-cut position such that, in the first pre-cut position, the rotating cutting tool is disposed adjacent the first workpiece and moves horizontally and transversely, simultaneously horizontally and transversely or horizontally, transversely and simultaneously horizontally and transversely to the first post-cut position to form the first desired configuration.

5. The cutting apparatus according to claim 4, wherein, during the second cutting stage, the rotary cutter mechanism moves from a second pre-cut position to a second post-cut position such that, in the second pre-cut position, the rotating cutting tool is disposed adjacent the second workpiece and moves horizontally and transversely, simultaneously horizontally and transversely or horizontally, transversely and simultaneously horizontally and transversely to the second post-cut position to form the second desired configuration.

6. The cutting apparatus according to claim 5, wherein, during the transition stage, the rotary cutter mechanism moves from the first post-cut position to the second pre-cut position such that, the rotating cutting tool moves vertically upwardly from the first post-cut position a sufficient vertical distance so that the rotating cutting tool is disposed above the first workpiece and thereafter moves at least horizontally towards the second workpiece and thereafter moves vertically downwardly adjacent the second workpiece until the rotary cutter mechanism is in the second pre-cut position.

7. The cutting apparatus according to claim 1, wherein the base frame is the box-shaped construction including a pair of side panels, a front panel and a rear panel, the table-top panel extending horizontally and transversely, the pair of side panels connected to and downwardly depending from the table-top panel along an opposing parallel pair of first side panel edges, the first pair of side panels facially opposing each other in a parallel manner and extending vertically and transversely, the front panel connected to and downwardly depending from the table-top panel along a front panel edge, the front panel extending vertically and horizontally, the rear panel facially opposing the front panel in a parallel manner and extending vertically and horizontally, the rear panel connected to and downwardly depending from the table-top panel along a rear panel edge and extend parallel to the front panel, the front and rear panels connected to and between respective ones of the pair of side panels.

8. The cutting apparatus according to claim 7, wherein the overhead frame includes a cross member and a pair of vertically-extending support members spaced apart from and facially opposing one another in a parallel manner, respective ones of the support members being connected to respective ones of the pair of side panels and projecting vertically relative to and above the table-top panel, the cross-member connected to and between the pair of support members above the table-top panel and the pair of holder assemblies.

9. The cutting apparatus according to claim 8, wherein the cutter assembly includes a cutter base panel and a cutter mounting panel operably connected to the cutter base panel, the cutter base panel operably connected to the cross-member to move horizontally thereacross, the cutter mounting panel fixedly connected to the rotary cutter mechanism and operably connected to the cutter base panel such that the rotary cutter mechanism is vertically movable relative to the cutter base panel.

10. The cutting apparatus according to claim 8, further comprising a horizontal cutter driver associated with the cross-member and cutter base panel and operative in conjunction with the controller to move the cutter assembly horizontally along the cross-member.

11. The cutting apparatus according to claim 10, further comprising a vertical cutter driver associated with the cutter base panel and cutter mounting panel and operative in conjunction with the controller to move the rotary cutter mechanism and the rotating cutting tool vertically relative to the cutter base panel.

12. The cutting apparatus according to claim 1, wherein each pair of angle members is operably connected to a holder driver for transversely moving the respective one of the pair of holder assemblies.

* * * * *